United States Patent

Rast, Jr. et al.

[11] 4,246,540
[45] Jan. 20, 1981

[54] FREQUENCY SYNTHESIZER EXTENDING METHOD AND APPARATUS

[75] Inventors: Gustaf J. Rast, Jr.; Thomas A. Barley, both of Huntsville, Ala.

[73] Assignee: The United States of America as represented by the Secretary of the Army, Washington, D.C.

[21] Appl. No.: 972,178

[22] Filed: Dec. 21, 1978

[51] Int. Cl.³ .......................................... H03B 19/00
[52] U.S. Cl. .................................................. 328/18
[58] Field of Search ...................... 328/14, 16, 17, 18

[56] References Cited

U.S. PATENT DOCUMENTS

| | | | |
|---|---|---|---|
| 2,354,800 | 8/1944 | Deal | 328/18 |
| 2,894,133 | 7/1959 | Bolie | 328/16 X |
| 3,495,158 | 2/1970 | Garnett et al. | 328/18 X |
| 3,628,154 | 12/1971 | Weill | 328/16 X |

Primary Examiner—John S. Heyman
Attorney, Agent, or Firm—Nathan Edelberg; Robert P. Gibson; Freddie M. Bush

[57] ABSTRACT

An apparatus and method for extending the frequency range of a synthesizer or signal generator upward by several orders of multiplication. The basic stability of the synthesizer or generator is maintained at the higher frequency output. The output band of frequencies from a frequency synthesizer is processed through a homodyne multiplier and multiplied. The multiplied output is coupled to a power divider. The divider output is coupled to bandpass filters allowing selection of harmonic multiples from overlapping frequency bands to be made. A low pass filter in the circuit allows reduction in harmonics and higher order frequencies.

5 Claims, 3 Drawing Figures

FREQUENCY SYNTHESIZER EXTENDING METHOD AND APPARATUS

DEDICATORY CLAUSE

The invention discribed herein may be manufactured, used, and licensed by or for the Government for governmental purposes without the payment to us of any royalities thereon.

SUMMARY OF THE INVENTION

An apparatus and method is disclosed for extending the frequency range of a synthesizer or signal generator upward by several orders of magnitude, such as 10 or 12. The basic stability of the synthesizer or generator is maintained at the higher frequency output. The resolution of a synthesizer with discrete step frequency change is reduced by the order of multiplication. Amplification is included for the output frequency to tailor the output signal to the desired power level.

DESCRIPTION OF THE PREFERRED EMBODIMENT

Figure 1:
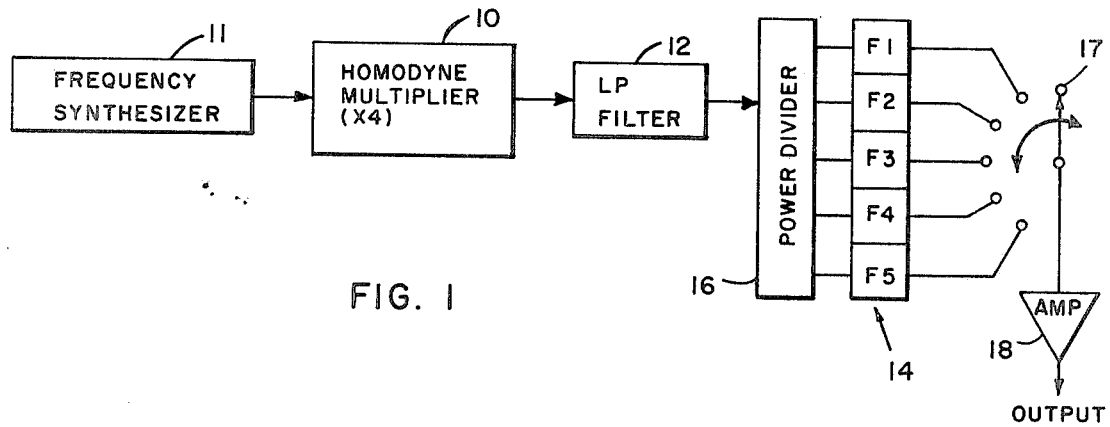
FIG. 1 is a perferred embodiment in block diagram of the frequency extending circuitry.

In providing high output frequencies from a relatively low frequency source, a frequency extending method and circuit such as that of FIG. 1 may be used as a single extending circuit or may be one building block of a series arrangement for providing very high, stable output frequencies with a low frequency source. As shown in FIG. 1, a frequency multiplier 10 is adapted for receiving an input frequency such as that from a signal generator or frequency synthesizer 11. The multiplier generates multiples of the input frequency as output signals. A low pass filter 12 is connected to the output of multiplier 10 and limits the frequency range of operation. The output frequencies from filter 12 are coupled to a bank of bandpass filters 14 composed of filters F1 through F5, having sequential, overlapping passbands. The number of filters in bank 14 may vary depending upon the desired frequency separation between adjacent frequencies and the total frequency range to be covered. A power divider 16 may be coupled between filter 12 and filter bank 14 for distribution of power to the filters. The outputs of filter F1–F5 are coupled to a selector switch 16 for selective coupling to an amplifier 18. The output of amplifier 18 may be coupled to using circuitry or may be coupled through one or more other frequency extending circuits to further extend the frequency range.

The multiplier 10 may be a homodyne multiplier similar to that taught by Barley and Rast, the inventors of the instant invention, in U.S. Pat. No. 3,772,584 wherein a frequency mixer has both the RF and LO input ports driven by the same signal source. The output of the mixer provides a large number of signals which have a high degree of phase coherence with the original input signal. A typical system which can operate with the output frequencies of the frequency extending circuit is that of the Exciter Frequency Agility System of U.S. Pat. No. 3,803,493, also issued to Barley and Rast. In FIG. 1 of the Agility System the frequency synthesizer output may be extended by applicants method prior to coupling to using circuitry.

Figure 2:
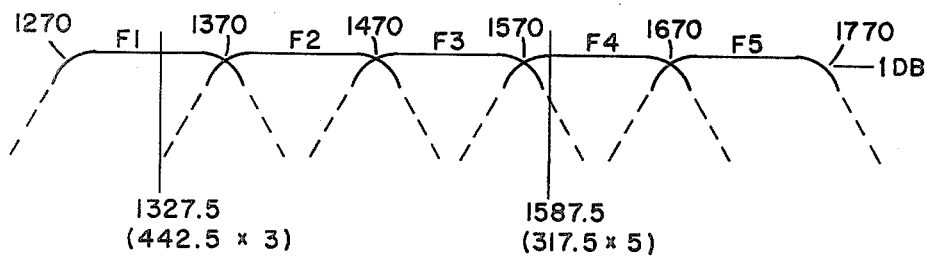
FIG. 2 is a waveform diagram of the overlapping pass-bands of the bandpsss filters of FIG. 1.

In a typical example a frequency synthesizer such as the Hewlett-Packard 5105/5110 can provide the frequency band of 317.5–442.5 MHz, while it may be desirable for this application to make frequencies available in the frequency band from 1270 to 1770 MHz. Thus, the output band of frequencies from synthesizer 11 is processed through a homodyne multiplier where it is multiplied by 4 to provide the desired frequency band as the 4th harmonic of the input band. As shown in FIG. 2, bandpass filters F1 through F5 are each 120 MHz wide at the 3 db points and overlap at 100 MHz intervals at the 1 db point. If a particular frequency within the passband is desired, the particular filter $F_n$ is selected to pass the frequency within that filter range.

Figure 3:
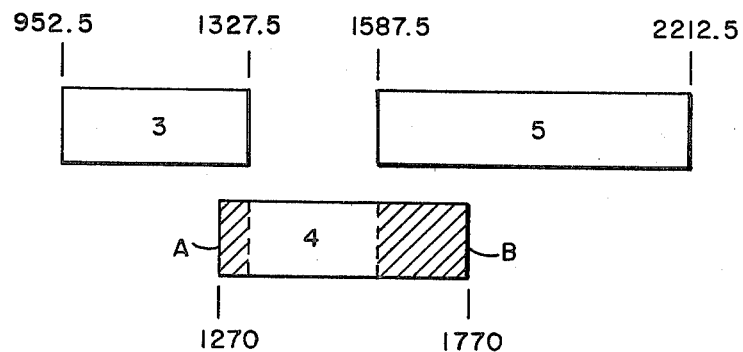
FIG. 3 is a bar chart showing the overlapping relationships of 3rd, 4th, and 5th harmonics for a typical frequency band of operation.

However, the 3rd harmonic of all frequencies between 423.3 and 442.5 MHz would be in the desired 1270–1770 MHz band, and the 5th harmonic of all frequencies between 317.5 and 354.0 would also be in the desired 1270–1770 band. All other order of harmonics are outside the band. The low pass filter 12 allows higher order frequencies and harmonics to be further reduced. FIG. 3 shows the 3rd, 4th, and 5th harmonic bands for the typical synthesizer input frequency band 317.5–354.0 MHz. The shaded areas A and B of harmonic band 4 shows the overlap areas of the 1270–1770 band with the 3rd and 5th harmonics respectively. Should the lowest frequency (1270 MHz) of the output band be selected, this would correspond to a synthesizer input frequency of 317.5 MHz. A 3rd harmonic spurious signal of 3×317.5 MHz=952.5 MHz would also be generated but it is below the cut-off frequency of filter F1 and well out of range for interference. Similarly, a 5th harmonic spurious signal of 5×317.5 MHz=1587.5 MHz would be generated but it is well above the cut-off frequency of F1 and will present no interference. These worse case comparisons show the broad separation of interference signals for proper filtering. For the example embodiment of five bandpass filters F1–F5 the filters will each have a bandpass corresponding to an equivalent synthesizer output frequency range. When the synthesizer frequency is 317.5–342.5 MHz, F1 is selected for the frequency band 1270–1370 MHz. When the synthesizer or fundamental frequency is 342.5–367.5 MHz, F2 is selected for 1370–1470 MHz. Similarly, with an input of 367.5–392.5 MHz, F3 is selected for 1470–1570 MHz; for an input of 392.5–417.5 MHz, F4 is selected for 1570–1670 MHz; and for an input of 417.5–442.5 MHz, F5 is selected for 1670–1770 MHz. The Texscan Corporation BD series of tubular filters are typical of filters which can provide the bandpass functions. While power divider 16 need not be used in all cases, where it is desired to control the power applied to a particular filter $F_n$, the divider may be utilized. Amplifier 18 allows the signal level coupled to a following stage or to a load circuit to be provided at a desired level. In operation, when a particular operating or output frequency is selected, the selector switch is placed in position to select the appropriate filter $F_n$ and the synthesizer is adjusted to provide the appropriate fundamental frequency output. A subsequent frequency range extending circuit can be coupled to receive the amplifier 18 output and further advance the frequency range of operation, while allowing the basic stability of the synthesizer/generator to be maintained at the higher frequency.

For the typical frequency band output of 1270-1770 MHz using the example Hewlett-Packard 5105/5110 synthesizer 0.4 Hz resolution is obtained, since the 0.1 Hz resolution of this synthesizer is multiplied by 4.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A frequency range extending circuit comprising: a multiplier adapted for receiving a range of low frequency input frequencies and having an output extended frequency range which is a harmonic multiple of the input range, an array of very high frequency bandpass filters coupled to receive the output of said multiplier, said filters having respective passbands of equal width and overlapping at the 1 db point and having respective filter outputs adapted for providing separate and distinct output frequency bands from adjacent and separate passbands.

2. A frequency range extending circuit as set forth in claim 1 and further comprising a low pass filter coupled between said multiplier and said bandpass filters.

3. A frequency range extending circuit as set forth in claim 2 and further comprising an output amplifier and a selector switch, said switch being coupled between the outputs of said bandpass filters and the input of said amplifier for selectively coupling respective filters of said filter array to said amplifier for selecting a particular frequency band output.

4. A frequency range extending circuit as set forth in claim 3 wherein said multiplier is a homodyne multiplier for providing high phase coherence with low frequency input frequencies and the multiplier output frequencies, and further comprising a power divider coupled between said low pass filter and said bandpass filter array for controlling power distribution between filters.

5. In a frequency generating system, a method of extending frequencies wherein a harmonic multiple of the input frequencies comprises the extended output frequencies and comprising the steps of:
multiplying fundamental input frequencies to provide selected harmonic, output frequencies;
selecting from respective frequency bands of operation within said harmonic band of frequencies; and
selectively bandpass filtering said respective frequency bands of operation for excluding spurious signals from adjacent harmonic bands.

* * * * *